United States Patent [19]

Du Bois et al.

[11] Patent Number: 4,518,982
[45] Date of Patent: May 21, 1985

[54] HIGH CURRENT PACKAGE WITH MULTI-LEVEL LEADS

[75] Inventors: Jerry M. Du Bois, Mesa; Keith G. Spanjer, Scottsdale, both of Ariz.

[73] Assignee: Motorola, Inc., Schaumburg, Ill.

[21] Appl. No.: 534,261

[22] Filed: Sep. 20, 1983

Related U.S. Application Data

[63] Continuation of Ser. No. 238,799, Feb. 27, 1981, abandoned.

[51] Int. Cl.³ .................... H01L 23/34; H01L 23/12; H01L 23/48; H01L 25/04
[52] U.S. Cl. ........................ 357/74; 357/81; 357/75; 357/68; 357/80; 357/82
[58] Field of Search ............... 357/81, 82, 74, 75, 357/68, 70, 71, 80

[56] References Cited

U.S. PATENT DOCUMENTS

| | | | |
|---|---|---|---|
| 3,509,434 | 4/1970 | Yanai et al. | 357/74 X |
| 3,649,803 | 3/1972 | Desmond et al. | 357/81 X |
| 3,918,084 | 11/1975 | Schierz | 357/82 |
| 3,946,428 | 3/1976 | Anazawa et al. | 357/74 |
| 4,047,197 | 9/1977 | Schierz | 357/81 |
| 4,067,040 | 1/1978 | Tsuzuki et al. | 357/80 |
| 4,079,410 | 3/1978 | Schierz | 357/75 |
| 4,106,052 | 8/1978 | Schierz | 357/75 |
| 4,128,802 | 12/1978 | Gansert et al. | 357/75 X |
| 4,139,859 | 2/1979 | Lewis et al. | 357/74 X |
| 4,213,141 | 7/1980 | Colussi | 357/74 |
| 4,242,598 | 12/1980 | Johnson et al. | 357/81 X |
| 4,322,735 | 3/1982 | Sadamasa et al. | 357/75 X |
| 4,359,754 | 11/1982 | Hayakawa et al. | 357/75 X |

FOREIGN PATENT DOCUMENTS 2819327 12/1979 Fed. Rep. of Germany ........ 357/75

Primary Examiner—Andrew J. James
Assistant Examiner—Sheila V. Clark
Attorney, Agent, or Firm—Robert M. Handy

[57] ABSTRACT

An improved high power semiconductor device and manufacturing method are described wherein one or more die are assembled to one electrode having a heat transfer face and additional insulated electrodes, said electrode having bent up and bent over portions forming high current terminals and control terminals such that the current terminals and control terminals lie in different planes and such that terminal spacings satisfy Underwriters Laboratory recommendations. The die and electrode assembly is partly encapsulated preferably in plastic. The current terminals are diagonally located to facilitate use of standard bus bar arrangements with different device orientations. Connection nuts are movably retained to limit transfer of tightening torque to the plastic body. Choices of materials are described.

15 Claims, 10 Drawing Figures

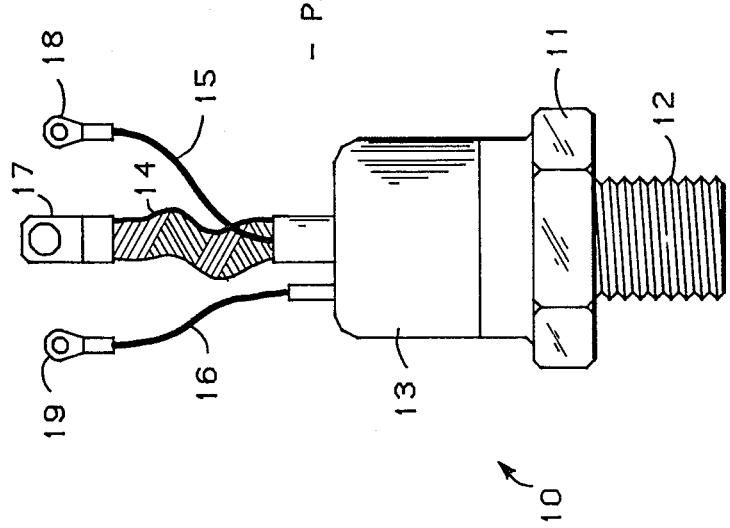
FIG 1 — PRIOR ART —
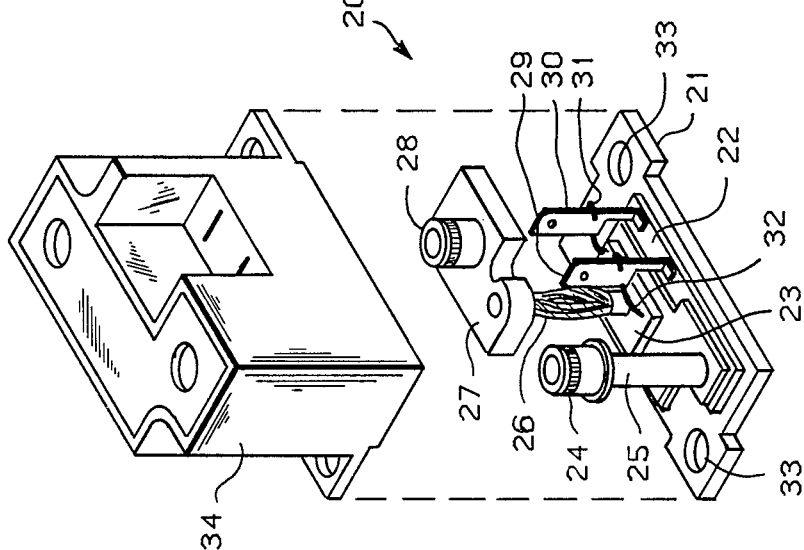
FIG 2 — PRIOR ART —

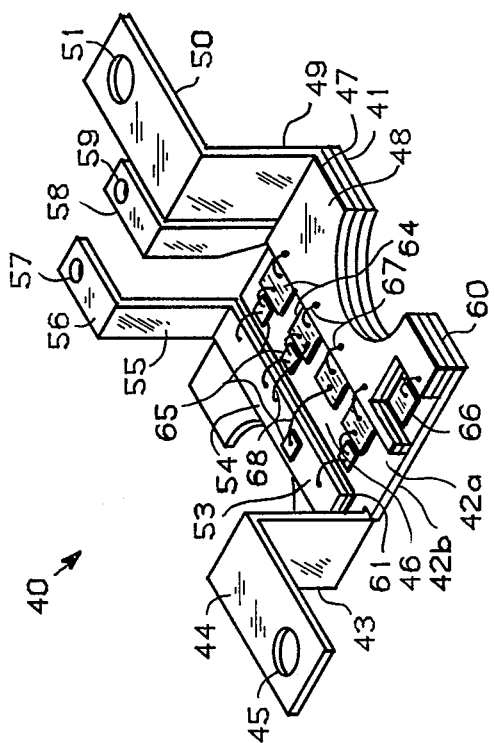
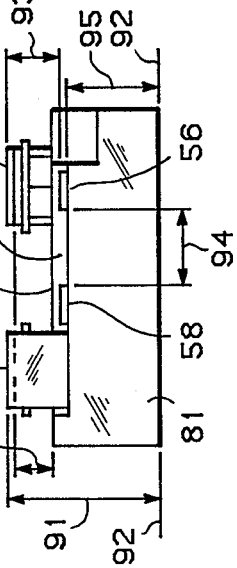
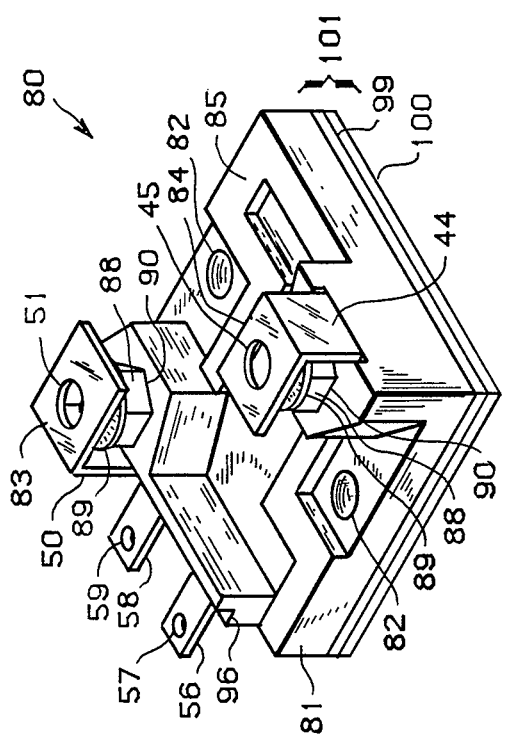
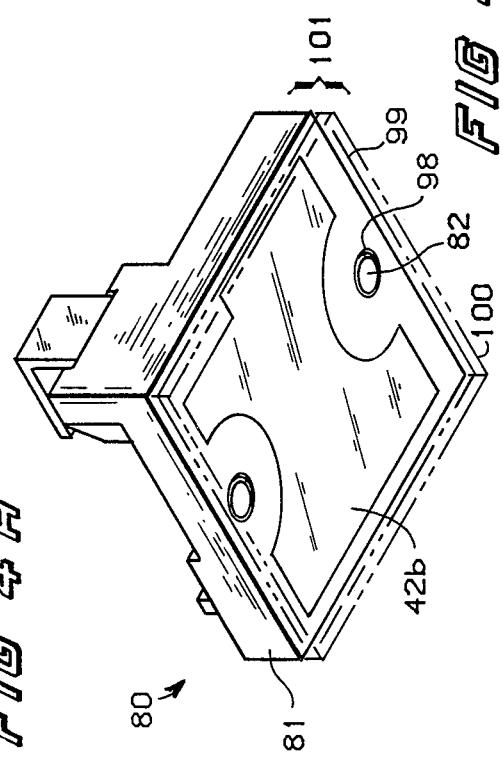

HIGH CURRENT PACKAGE WITH MULTI-LEVEL LEADS

This is a continuation of application Ser. No. 238,799, filed Feb. 27, 1981, now abandoned.

BACKGROUND OF THE INVENTION

This invention relates to improved semiconductor devices and, more particularly, to a package for high current semiconductor devices using one or more semiconductor chips.

High power semiconductor devices are widely used but nonetheless costly. Their high cost stems principally from the use of expensive materials and complicated means of assembly. For example, prior art semiconductor power devices typically utilize massive copper bases, many internal piece parts, expensive ceramic insulators, and expensive assembly techniques.

In addition to being costly, prior art power semiconductor devices of high current carrying capacity are difficult or awkward to install, particularly when they must be grouped into arrays of several devices and isolated from the mounting surface. The shape and terminal arrangements of prior art devices make it inconvenient to assemble them to heat sinks and to the bus bars which interconnect the devices in an array. For example, flexible leads are frequently provided requiring that bus bars be independently supported. Furthermore, many prior art devices do not meet the minimum terminal spacing requirements which have been established by the Underwriters Laboratories in Bulletin UL508, Table 18.1 dated Aug. 19, 1977, as the recommended practice for components which are to be utilized in industrial environments. According to these recommendations, one-half inch (1.27 cm) is to be maintained through air between a high voltage ("hot") lead and the heat sink or cabinet to which the device is mounted, and three-eighths inch (0.76 cm) through air between any other terminals of substantially different potential.

Some attempts have been made to design new power semiconductor devices which are easier to install and use, particularly in arrays. However, these improved devices have not overcome all of the deficiencies of the prior art devices and are still costly. Thus a need continues to exist for low cost, rugged semiconductor power devices which are well adapted to industrial environments, which are easy to install and use mechanically, and which permit a flexible self-supporting arrangement of interconnecting bus bars.

Accordingly, it is an object of the present invention to provide an improved semiconductor power device of lower cost for a given performance rating.

It is a further object of this invention to provide an improved semiconductor power device meeting recommended minimum spacing of hot leads.

It is an additional object of this invention to provide an improved semiconductor power device which has great flexibility of installation and mechanical convenience of use.

It is a further object of this invention to provide an improved semiconductor power device which is rugged and especially suitable for industrial environments.

It is an additional object of this invention to provide an improved semiconductor device which is assembled from a small number of piece parts held in place by a dielectric adhesive.

It is a further object of this invention to provide an improved semiconductor power device which is particularly adapted to enable the use of a plurality of semiconductor chips.

It is an additional object of this invention to provide an improved semiconductor device wherein internal electrodes or terminal members are arranged to simplify connection of a plurality of semiconductor chips to said terminal members without crossover of the interconnection means.

It is a further object of the present invention to provide an improved method for the manufacture of semiconductor power devices of improved performance.

It is an additional object of the present invention to provide high current power terminals which directly support bus bars in a plane separated from the plane of the control or signal leads.

SUMMARY OF THE INVENTION

The attainment of the foregoing and other objectives and advantages, is achieved through the present invention wherein one or more semiconductor chips are bonded to a planar portion of a first electrode or terminal member which has an opposed heat transfer face, and to which are also attached by insulating means at least one but usually a second and third electrode or terminal member. These terminal members are arranged in a spaced apart and substantially parallel relationship alongside the chip bonding region to permit simplified electrical connection of the semiconductor chips to the terminal members or electrodes. This assembly of parts is encapsulated, preferably in plastic, except that the heat transfer face and the terminal portions of the various electrodes are exposed. Further, the power or high current terminal portions are diagonally arranged and bent back over the encapsulated assembly to movably retain connection nuts in complementary recesses molded into the encapsulation, these high current terminals being spaced away from the heat transfer face and from the signal or control leads by predetermined minimum distances. The connection nuts are retained until electrical connection screws tighten whereupon they lift out of the complementary recesses so that final tightening torque is absorbed by the terminals. A dielectric adhesive material is used to insulate the second and third electrode members from the first electrode member. Electrical isolation of the device from a mounting surface is obtained by a separate or integral insulation layer.

BRIEF DESCRIPTION OF THE DRAWINGS

A more complete understanding of the present invention can be gained by considering the following detailed description in conjunction with the accompanying drawings, in which FIG. 1 illustrates a prior art device of the threaded stud and pig-tail lead type;

FIG. 2 illustrates an improved prior art device;

FIG. 3 illustrates the internal members of the improved semiconductor device of the present invention;

FIGS. 4A–4C illustrates different views of the encapsulated semiconductor device of the present invention wherein the terminals have been formed to retain the connection nuts, FIG. 4A showing upper surface features, FIG. 4B lower surface features, and FIG. 4C a side view;

DETAILED DESCRIPTION OF THE PREFERRED EMBODIMENT

Figure 5A:
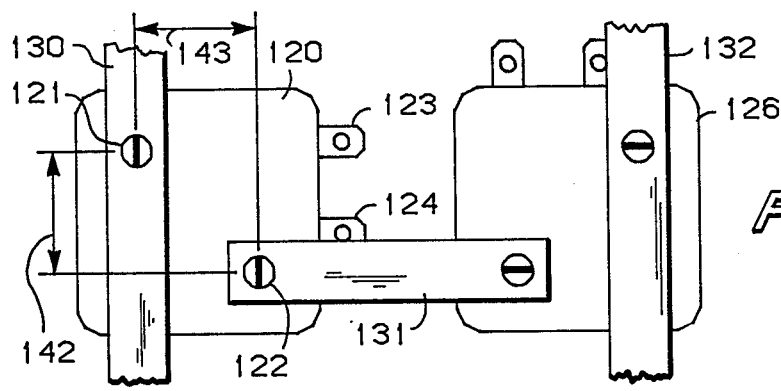
FIGS. 5A-5D illustrates different orientations in which the invented semiconductor device may be installed to achieve convenient bussing.

FIG. 1 illustrates a prior art example of a pig-tail lead type semiconductor power device 10 having a heavy hexagonal copper base 11, threaded mounting stud 12 and ceramic insulator 13. The high current or power connections to the device are through threaded stud 12 and braided pig-tail lead 14 by means of terminal connection 17. The control signals are applied through flexible leads 15-16 via terminals 18-19. Because power lead 14 is flexible, a bus bar used to interconnect devices of this type must be separately supported. This is a disadvantage. This type of prior art device is rugged, but is relatively expensive and awkward to isolate from a heat sink.

FIG. 2 illustrates improved power semiconductor device 20 having copper base 21, ceramic insulator 22 and semiconductor chip 23 in stacked relationship. Power is fed into the device through terminals comprising tapped ferrules 24 and 28 which are fixed in the plastic encapsulating material and connected to the semiconductor die through leads 25 and 27, and flexible braided lead 26. Control signals are supplied through terminals 29 and 30 which are connected to semiconductor chip 23 by bonding wires 31 and 32. Plastic filled housing 34 surrounds the assembly. Holes 33 are used to mount device 20 to a heat sink.

While device 20 overcomes a disadvantage of the prior art device of FIG. 1 in that interconnecting bus bars may be supported by and attached directly to device terminals 24 and 28 without need for external support, many deficiencies remain. For example, a complex assembly of many internal piece parts is needed. There is a lack of rotational symmetry with respect to orientation of power terminals 24 and 28. It is difficult to access control signal terminals 29 and 30 in the presence of bus bars running across the top of the device. Additionally, the devices of FIGS. 1 and 2 are designed for use with a single large semiconductor die, which leads to increased risk of die cracking during or after assembly.

The deficiencies of the prior art devices of FIGS. 1 and 2 are overcome by the present invention, the internal structure of which is illustrated in a preferred embodiment in FIG. 3. Internal device assembly 40 is constructed from first terminal member or electrode 41 having planar portion 42a-b, bent up or step portion 43, and terminal portion 44 which forms a high current or power terminal having connection hole 45 therein. Planar portion 42a-b has a first face 42a on which semiconductor chips 64-66 and terminal members 47 and 53 are mounted and a second opposite face 42b which serves as a heat transfer face for extracting heat from the finished device.

Second terminal member 47 having planar portion 48 is mounted on planar portion 42a of first member 41 by insulating means 60. Second terminal member or electrode 47 has bent up or step portion 49 and terminal portion 50 forming another power or high current terminal with connection hole 51. Signal or control lead terminal 58 with hole 59 is formed preferably of the same material as second terminal member 47, and is preferably a part thereof but of different thickness. Third terminal member 53 having planar portion 54 is attached to planar portion 42a of first terminal member 41 by insulating means 61. Third terminal member 53 has bent up or step portion 55 and terminal portion 56 with hole 57. Portion 56 with hole 57 forms another signal or control lead terminal.

Second terminal member 47 and third terminal member 53 are in spaced apart relationship, defining therebetween bonding region 46 of planar portion 42a of first terminal member 41. One or more power semiconductor chips 64 are attached to first terminal member 41 in bonding region 46. Auxiliary semiconductor chips 65 and 66 may be optionally bonded to first terminal member 41 in bonding region 46, in other locations of planar portion 42a, or on planar portions 48 or 54 of terminal members 47 or 53. Semiconductor chips 64 are electrically coupled to planar portion 48 of second terminal member 47 by bonding wires 67, and to planar portion 54 of third terminal member 53 by bonding wires 68. Auxiliary chips 65 and 66 can be electrically coupled to second and/or third terminal members 47 and 53 and/or other chips as necessary to achieve a desired circuit function. Desirable auxiliary chips and interconnections are, for example, one or more power diodes (snubbers) connected across an emitter-collector of a power transistor chip to suppress transients, one or more speed-up diodes connected across an emitter-base of a power transistor or power Darlington chip to improve transient response, and/or one or more resistance means connected in series with emitters or bases of power transistors to improve current sharing among several transistor chips. Other auxiliary chips and connections are also useful.

While semiconductor devices 64 and assembly 40 have been illustrated for the case of active semiconductor devices requiring three terminal connections, it will be readily apparent to those skilled in the art that substantially the same structure but with a smaller or larger number of terminals could be utilized with semiconductor chips or other components requiring two, three or four or more terminal connections. Terminal member 41 also serves as a sink for the heat generated within the semiconductor chips, transferring this heat in turn to an external heat sink via heat transfer face 42b. Hence, the means used to bond, attach, or couple semiconductor chips 64-66 to terminal member 41 should desirably provide good thermal contact. An intermediate electrical isolation means can be used between any of the semiconductor chips and the terminal members if desired, provided good thermal contact is maintained.

While assembly 40 has been illustrated for the case where a multiplicity of semiconductor chips has been utilized, it will be apparent that any number of chips consistent with the total available planar portion area could have been utilized. The same current handling capability can be obtained, for example, by using one large chip, or a multiplicity of smaller chips. Assembly 40 is particularly well suited for use with a multiplicity of chips. This is an advantage, since it is well known per se in the art that the yield of semiconductor chips decreases rapidly with increasing active chip area. A multiplicity of smaller chips operating in parallel can be used in place of a single large chip, and economic advantage realized thereby, provided that current flow through the individual chips is substantially equal. To prevent current "hogging" by any one chip, it is desirable that electrical parameters such as, for example, safe operating area, switching time, and forward drop of individual chips be substantially matched. This may be accomplished by testing and selecting individual chips prior to assembly by means well known in the art. However, it has been discovered that by choosing chips from the same wafer, that the necessary degree of matching may be readily obtained without further individual selection. Thus, the same piece parts, e.g. terminal members 41, 47 and 53 may be used to produce finished devices of a variety of current ratings simply by varying the number of parallel connected semiconductor die or chips bonded to assembly 40. This is a significant manufacturing convenience. The requirement for choosing die from the same wafer does not cause waste, since any die left over can be used for the assembly of individually packaged devices. It will also be readily apparent to those skilled in the art that a variety of passive and active components such as diodes, transistors, thyristors, light actuated devices, field effect devices, integrated circuits, and combinations thereof as well as resistors, capacitors and inductors, can be utilized in assembly 40 to obtain a variety of device functions and capabilities. The substantially parallel spaced apart arrangement of terminal members 47 and 53 to give approximately rectangular bonding region 46 permits chips 64-65 to be placed in region 46 in such a way as to permit wire bonding of the chips, for example, to members 47 and 53 without the wire bonds having to cross over each other. This simplifies assembly and reduces cost. Other techniques to connect to the devices may also be used.

FIGS. 4A-4C illustrates a preferred embodiment of encapsulated semiconductor device 80 of the present invention, having plastic body 81 with mounting holes 82 and strength providing ridge 85. Heat transfer surface 42b protrudes a predetermined distance in the range 0-20 mils (0-0.050 cm) but preferably 2 mils (0.005 cm) from bottom surface 92 of body 81. Lower portions 98 of mounting holes 82 have been enlarged to accommodate drilling burrs which may be present on the external heat sink to which device 80 is attached, and which might otherwise prevent heat transfer surface 42b from making substantially uniform contact to the heat sink.

Terminal portions 44, 50, 56 and 58 protrude from various locations of encapsulated device 80. Power terminal portions 44 and 50 have been bent inward to form inward facing and substantially coplanar terminal portions 83 and 84 with connection holes 51 and 45. Inward facing terminal portions 83 and 84 retain connection nuts 88 in portions 90 of plastic body 81 which have a shape complementary to nuts 88 so as to prevent them initially from turning when connection screws (not shown) are installed through holes 45 and 51. Retained nuts 88 preferably have integral locking washer portions 89 facing upward toward the underside of inward facing terminal portion 83-84. The dimensions of nuts 88, complementary portions 90, and inward facing terminal portions 83-84 are adjusted so that distance 97 (FIG. 4C) between the underside of terminal portions 83-84 and the top of complementary plastic encapsulation portions 90 is approximately equal to the combined height of nut 88 and washer 89. As a result, when nuts 88 are drawn up against the underside of terminal portions 83-84, then nuts 88 are no longer retained by complementary portions 90. This arrangement greatly facilitates connection to the invented device in that nuts 88 are initially retained by complementary portions 90 and prevented from turning under the influence of connection screws (not shown) inserted through holes 51 and 45. This retaining action continues until substantially all of the slack between nuts 88 and the undersurface of terminal portions 83-84 has been taken up. As nuts 88 pull up tight against the undersurface of terminal portions 83-84 they rise up out of complementary retaining portions 90 at substantially the same time as integral locking washers 89 engage the underside of terminal portions 83-84. The large values of torque associated with final tightening of the connection screws to main power 83—83 terminals are thus transferred to the main power terminals and not directly to the plastic body of the device which would occur if nuts 88 were integrally molded into plastic body 81. Transmission of the torque through terminal portions 44 and 50 is less likely to damage plastic body 81 since terminal portions 44 and 50 exterior to plastic body 81 can flex, providing stress relief.

Encapsulated device 80 is preferably of approximately rectangular shape with terminal portions 83-84 diametrically opposed, arranged in this case approximately on a diagonal. As an example of a device built in accordance with the present invention, encapsulated device 80 is 2.25 inches (5.7 cm) square with connection holes 45 and 51 located 1.76 inches (4.5 cm) apart symmetrically along a diagonal so that bus bars parallel to any opposed pair of substantially rectangular sides of device 81 can have center to center spacing of 1.25 inches (3.2 cm). As another example, encapsulated device 80 is 2.1 inches (5.3 cm) by 2.25 inches (5.7 cm) with connection holes 45 and 51 diagonally arranged and having lateral spacings (dimensions 142 and 143 of FIG. 5) of 1.25 inches (3.2 cm) and 1.29 inches (3.3 cm), which fix the corresponding bus bar spacing.

Control signal terminals 56 and 58 protrude from a side of encapsulated device 80 and are separated from bottom plane 92 by distance 95 which preferably equals or exceeds current Underwriter Laboratories' minimum specifications of one-half inch (1.27 cm). Terminals 56 and 58 are separated by distance 94 which equals or exceeds Underwriters Laboratories' specifications of three-eighths inch (0.95 cm). Terminals 56 and 58 are substantially coplanar and separated from the plane of high current power terminals 83-84 by distance 93 which equals or exceeds Underwriters Laboratories' specifications of three-eighths inch (0.95 cm). Similarly, power terminal portions 83-84 are separated from base plane 92 by distance 91 of approximately 0.8 inch (2 cm). Vertical separation 93 of control signal terminals 56 and 58 and power terminals 83-84 makes it possible to run bus lines in any direction across device 80 including those directions which cross over control signal terminals 56 and 58. This is a significant advantage and convenience to the user. Plastic body 81 is notched in portion 96 to permit terminals 56 and 58 to be bent into an upright position if desired. Control terminals 56 and 58 are preferably of dimensions to accept push-on connector plugs. However, other means of connection are satisfactory.

Device 80 may be conveniently electrically isolated from an external heat sink on which it is to be mounted by providing an insulating washer between heat transfer surface 42b and the external heat sink. Mica and Kapton, both well known per se in the art are examples of suitable washer materials. Insulated mounting hardware is not required since mounting holes 82 formed in insulating encapsulation body 81 are inherently isolated.

Alternatively, device 80 may include insulating layer 99 of good thermal conductivity permanently bonded to heat transfer face 42b. Low temperature glasses, insulating plastic, or adhesive ceramics are examples of materials suitable for insulating layer 99. In order to insure good thermal contact to an external heat sink it is desirable that additional metallic heat spreader 100 be bonded to insulating layer 99 so as to form metal-insulator-metal sandwich 101 comprising regions 42b-99-100. Metallic heat spreader 100 protects insulating layer 99 from abrasion or puncture and simplifies installation by the user. Sandwich 101 can be formed at the same time as terminal members 47 and 53 are attached to face 42a of terminal 41 and similar materials used. Copper, aluminum, steel and thermally conducting alloy materials are useful heat spreader materials.

In a preferred embodiment of a device handling 200–250 amperes, terminal members 41 and 47 are formed of 0.06 inch (0.15 cm) copper and terminal member 53 and control or signal terminal 56 are formed of 0.03 inch (0.08 cm) copper. Signal terminal 58 is conveniently formed from 0.06 inch (0.15 cm) copper as a part of terminal member 47 and thinned to 0.03 inch (0.08 cm). The copper is preferably nickel plated, but this is not essential. Other conductive materials such as aluminum or steel or combinations of metals may also be used. Insulating means 60 and 61 comprise a dielectric adhesive material of predetermined thickness, typically 10 mils (0.025 cm). A plastic impregnated glass material is preferred but ceramic, glass or other adhesive dielectric materials as well as smaller or larger thicknesses may be used (e.g. 3–60 mils; 0.008–0.15 cm).

Device 80 can be made as follows: Terminal members 41, 47 and 53 are stamped or etched typically from copper and formed to substantially the shape shown in FIG. 3. These parts are preferably nickel plated although plating is not essential. Semiconductor chips 64 and, optionally, 65 and 66, are bonded to planar portion 42a of first terminal member 41 by methods well known per se in the art. Terminal member 41 is then placed in an alignment jig. Preforms of dielectric adhesive material 60 and 61 are applied to terminal members 47 and 53 which are then placed against terminal member 41 in the alignment jig and bonded together. An epoxy impregnated glass material may be conveniently used as the dielectric adhesive, but other materials such as ceramics, low temperature glasses or other materials with or without organic binders give satisfactory results. Wire bonds are formed by conventional means to electrically connect various regions of the semiconductor chips to the terminal members. A conventional die coat is applied and the completed assembly inserted in a mold cavity. Surface 42b of terminal member 41 is pressed tightly against a face of the mold cavity so that during encapsulation no plastic material penetrates beneath surface 42b. A slight depression is provided in the mold cavity conforming to the shape of surface 42b of terminal member 41 so that in the finished product, heat transfer surface 42b protrudes by a small amount, typically 2 mils (0.005 cm), from bottom surface 92 of plastic body 81.

The assembly is encapsulated by methods well known per se in the art, preferably with a high strength plastic material such as a glass filled epoxy or a polyimide. Other materials such as low temperature glasses or ceramics may be used. Following encapsulation the power terminals are conveniently formed so as to retain attachment nuts 88. It will be readily apparent to those skilled in the art that certain operations such as chip attachment, terminal member assembly, and forming can be carried out in a different sequence. For example, terminal members 41, 47 and 53 may be formed to the shape illustrated in FIG. 3 before or after assembly.

It will also be readily apparent to those skilled in the art that the method and structure disclosed herein is particularly flexible in that the number, size, shape and function of semiconductor chips or other components installed within device 80 can be readily varied in order to change the device performance and device function without the necessity of redesigning the chips themselves. This provides great flexibility and manufacturing convenience.

Figure 5B:
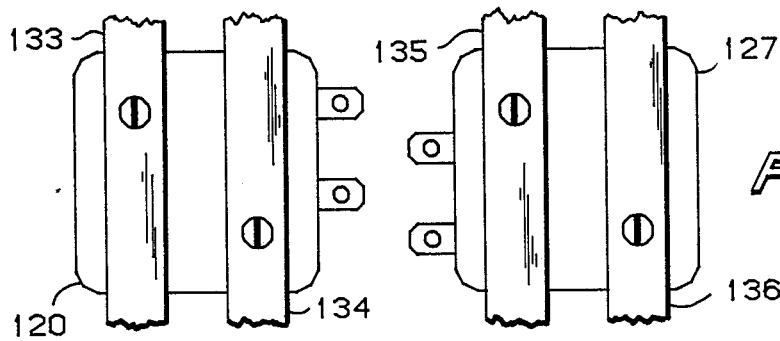
Figure 5C:
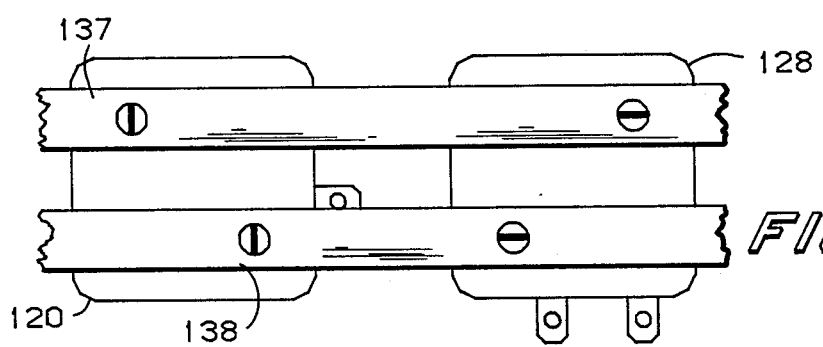
Figure 5D:
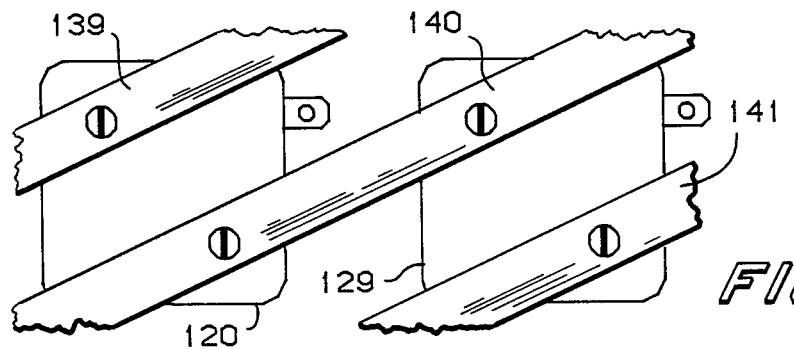

FIGS. 5A–D illustrates different orientations in which the invented semiconductor power device may be installed to achieve convenient bussing and control signal terminal arrangements. In FIG. 5A semiconductor device 120 with high current power terminals 121-122 and control signal terminals 123-124 is shown in top view connected to similar device 126 by bus bar 131 and further bus bars 130 and 132. Terminals 121-122 are separated by lateral spacing dimensions 142 and 143. Device 120 has been oriented with control signal terminals 123-124 facing to the right. Device 126 has control signal terminals facing up. In FIGS. 5B–D the orientation of device 120 is held constant while similar devices 127-129 are rotated in ninety degree increments to illustrate the possible orientations. Bus bars 130-141 illustrate a number of possible means of interconnecting devices of varying orientation. For an embodiment where power terminals 121-122 are symmetrically located on the diagonal of the device, and dimensions 142 and 143 are equal, terminals 121-122 successively occupy the corners of a square as the device is rotated in ninety degree increments. Thus a standard bus bar spacing may be adopted and either of the two high current power leads brought into contact with either of the two bus bars by simply rotating the device by ninety degrees in the arrangement of FIG. 5B or 5C, or by one hundred and eighty degrees in the arrangement of FIG. 5D. Where dimensions 142 and 143 are not equal, then rotation by one hundred and eighty degrees is required to interchange power terminals with fixed bus spacing.

Another important feature of the device design is shown in FIG. 5B where it will be apparent that control signal terminals 123 and 124 have been located asymmetrically so that when devices 120 and 127 are placed facing each other that the control signal leads of device 120 interleave with those of device 127. This permits the devices to be more compactly arranged in an array and reduces the total space required.

Thus it is apparent that there has been provided in accordance with this invention a method and structure for an improved power semiconductor device of lower cost, which meets Underwriters' Laboratories recommended specifications for minimum separation of hot leads, which has great flexibility of installation and mechanical convenience of use, which is rugged and especially suitable for industrial environments, which may be assembled with a small number of piece parts held in place by dielectric adhesive materials, which is adapted to the use of a plurality of semiconductor chips, wherein the terminal members are arranged in a substantially parallel fashion to simplify the location and bonding to a plurality of semiconductor devices without cross-overs of the bonding wires, which provides for the separation by levels of the power terminals and signal terminals and through symmetry and location of the various terminals a multiplicity of convenient arrangements for forming arrays of devices, and which may be conveniently isolated from external heat sinks by use of an integral insulating layer and heat spreader or by means of an insulating washer without use of insulating mounting hardware.

Having thus described the invention, it will be apparent to those skilled in the art that various modifications can be made within the spirit and scope of the present invention. Accordingly, it is intended to encompass all such modifications.

We claim:

1. A high current semiconductor device comprising:
   a base electrode having a bent-up portion located substantially at one corner of said base electrode and extending at substantially a right angle from said base electrode, and having a bent-over portion extending from said bent-up portion forming a first external connection means;
   wherein said base electrode has an elongated die attach portion having first and second long sides, and wherein said die attach portion is adapted to receive semiconductor die between said first and second long sides, wherein said elongated die attach portion extends away from said bent-up portion of said base electrode in a direction substantially parallel with said bent-over portion;
   a first electrode having an elongated first planar portion bonded by insulating means to said base electrode along said first long side of said elongated die attach portion of said base electrode, a bent-up portion extending at substantially a right angle from an end of said elongated first planar portion, and a bent-over portion extending from said bent-up portion substantially parallel with said elongated first planar portion and aligned substantially parallel with said first long side of said die attach portion, wherein said bent-over portion forms a second external connection means;
   a second electrode, separate from said first electrode, having an elongated second planar portion bonded by insulating means to said base electrode along said second long side of said elongated die attach portion of said base electrode, a bent-up portion extending at substantially a right angle from said elongated second planar portion, and a bent-over portion extending from said bent-up portion substantially parallel with said elongated second planar portion and aligned substantially parallel with said second long side of said die attach portion, wherein said bent-over portion forms a third external connection means; and
   encapsulating means adapted to cover said die attach portion of said base electrode, said elongated planar portions of said first and second insulated electrodes, and at least a part of said bent-up portions, leaving free at least part of said bent-over portions which form said external connection means.

2. The high current semiconductor device of claim 1 further comprising at least one recess in said encapsulation means below at least one of said external connection means, wherein said recess has sidewall portions containing anti-rotation means adapted to movably retain an attachment nut so as to prevent rotation of said attachment nut while allowing it to move toward said external connection means.

3. The high current semiconductor device of claim 2 wherein said anti-rotation means releases said nut when said nut seats against said external connections means.

4. The high current semiconductor device of claim 1 further comprising notched portions in said base electrode adapted to allow passage of mounting screws without electrical contact with said base electrode.

5. The high current semiconductor device of claim 4 further comprising mounting holes formed in said encapsulation means aligned above said notched portions to provide insulated mounting means.

6. The high current semiconductor device of claim 5 wherein said mounting holes are enlarged at one end.

7. The high current semiconductor device of claim 1 wherein said bent-up portion of said first electrode is located substantially at a corner of said base electrode diagonally opposite said bent-up portion of said base electrode.

8. The high current semiconductor device of claim 7 wherein said bent-up portion of said second electrode is located at a corner of said base electrode opposite said bent-up portion of said base electrode and on the same side of said base electrode as said bent-up portion of said first electrode.

9. The high current semiconductor device of claim 1 wherein said bent-over portions of said base electrode and said first electrode have substantially the same height above said base electrode.

10. The high current semiconductor device of claim 9 wherein said bent-over portion of said second electrode is located closer to said base electrode than said bent-over portion of said base electrode.

11. The high current semiconductor device of claim 1 wherein said base electrode, and said bent-up and bent-over portion of said base electrode, are a single piece of metal.

12. The high current semiconductor device of claim 1 further comprising and electrically insulating and thermally conductive layer bonded to said base electrode on a surface opposite said die attach portion.

13. A high current semiconductor device comprising:
   a metallic base electrode having first and second planar surfaces;
   a rectangular die attach area on said first surface of said base electrode, wherein said die attach area has a length extending substantially across said base electrode and a width less than said length, wherein the length is oriented substantially perpendicular to a first edge of said base electrode, and wherein said width is defined by spaced apart first and second boundaries extending in the length direction;
   first and second isolated electrodes mounted on said base electrode by insulating means along said first and second boundries, wherein said mounted portions of said first and second electrodes are aligned substantially perpendicular to said first edge of said base electrode;
   a third electrode extending from said base electrode;
   wherein said first, second, and third electrodes have upright portions extending substantially perpendicular to said first surface of said base electrode;
   wherein said upright portions of said first and second electrodes are located substantially adjacent said first edge of said substrate, and said upright portion of said third electrode is located substantially adjacent a second edge of said substrate;
   at least one semiconductor die disposed on said die attach area connected to said first and second electrodes; and encapsulation means covering said first face of said base electrode while leaving at least a part of said upright portions of said electrodes free to serve as external connections means.

14. The high current semiconductor device of claim 13 wherein said first, second, and third electrodes have bent-over portions substantially parallel to said first surface of said base electrode.

15. The high current semiconductor device of claim 13 wherein said at least one semiconductor die is mounted on said die attach area by insulating means.

* * * * *